United States Patent
Braeuer et al.

(10) Patent No.: US 10,775,170 B2
(45) Date of Patent: Sep. 15, 2020

(54) METHOD FOR MANUFACTURING A MEMS ELEMENT

(71) Applicant: Robert Bosch GmbH, Stuttgart (DE)

(72) Inventors: Joerg Braeuer, Nehren (DE); Christian Hoeppner, Stuttgart (DE); Lars Tebje, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 15/253,345

(22) Filed: Aug. 31, 2016

(65) Prior Publication Data

US 2017/0059321 A1   Mar. 2, 2017

(30) Foreign Application Priority Data

Sep. 2, 2015   (DE) .................. 10 2015 216 799

(51) Int. Cl.
| | | |
|---|---|---|
| *G01C 19/5712* | (2012.01) | |
| *B81C 1/00* | (2006.01) | |
| *B81B 7/00* | (2006.01) | |
| *B81B 3/00* | (2006.01) | |

(52) U.S. Cl.
CPC ........ *G01C 19/5712* (2013.01); *B81B 3/0032* (2013.01); *B81B 7/0016* (2013.01); *B81C 1/0019* (2013.01); *B81C 1/00333* (2013.01); *B81C 1/00484* (2013.01); *B81B 2201/025* (2013.01)

(58) Field of Classification Search
CPC ............ B81B 2201/025; B81B 3/0032; B81B 7/0016; B81C 1/0019; B81C 1/00333; B81C 1/00484; G01C 19/5712; G01C 25/00; G01C 19/5769

See application file for complete search history.

(56) References Cited

U.S. PATENT DOCUMENTS

| | | | |
|---|---|---|---|
| 6,756,247 B1 * | 6/2004 | Davis ................. | B81C 1/00484 438/52 |
| 6,844,623 B1 * | 1/2005 | Peterson ............. | B81C 1/00333 257/682 |
| 7,295,726 B1 * | 11/2007 | Milanovic ............. | B81B 3/0062 385/14 |
| 7,319,260 B1 * | 1/2008 | Michalicek ........... | B81C 1/0023 257/204 |
| 9,550,668 B1 * | 1/2017 | Xia ........................ | H01L 29/84 |
| 2006/0148133 A1 * | 7/2006 | Nunan ................ | B81C 1/00476 438/117 |
| 2012/0120470 A1 * | 5/2012 | Kitazawa ............... | H02N 1/006 359/200.1 |
| 2014/0002178 A1 * | 1/2014 | Teh ........................ | H01L 24/19 327/525 |
| 2014/0230547 A1 * | 8/2014 | El-Gamal et ...... | G01C 19/5698 73/504.12 |
| 2016/0368763 A1 * | 12/2016 | Gonska ............... | B81C 1/00293 |

* cited by examiner

*Primary Examiner* — Matthew L Reames
*Assistant Examiner* — Benjamin Tzu-Hung Liu
(74) *Attorney, Agent, or Firm* — Norton Rose Fulbright US LLP; Gerard Messina

(57) ABSTRACT

A method for manufacturing a MEMS element, including the following: forming a least one stationary weight element and at least one moving weight element in the MEMS element, and positioning at least one fixing element at the stationary weight element and at the moving weight element, the fixing element being formed so as to be able to be severed.

28 Claims, 7 Drawing Sheets

METHOD FOR MANUFACTURING A MEMS ELEMENT

RELATED APPLICATION INFORMATION

The present application claims priority to and the benefit of German patent application no. 10 2015 216 799.2, which was filed in Germany on Sep. 2, 2015, the disclosure of which is incorporated herein by reference.

FIELD OF THE INVENTION

The present invention relates to a method for manufacturing a MEMS element. The present invention further relates to a MEMS element.

BACKGROUND INFORMATION

Today, microsensors or microsystems used, in particular, in the consumer sector are becoming more and more complex, which means that more and more functions must be integrated into a component while simultaneously reducing the dimensions of the component. Examples of this include acceleration sensors and/or yaw-rate sensors or gyroscopes and so-called inertial measurement units, that is, combinations of, in each instance, an acceleration sensor and a yaw-rate sensor. Current sensor dimensions are on the order of app. 2×2 mm$^2$, with a component height of app. <1 mm. In the case of microelectromechanical systems (MEMS), the integration density becoming greater and greater due to this produces, in particular, smaller and smaller structures and dimensions. Among other things, the sensor core, that is, the part of the sensor that is provided for the actual detection of, e.g., accelerations and/or rates of rotation, is regarded as a critical component of the MEMS.

In particular, the small gap spacing (gaps) in the lower micrometer range prevailing in the sensor core, between moving and stationary structures, may produce a high degree of technological difficulty Thus, among other things, manufacturing processes following the actual MEMS manufacturing (e.g., handling and packaging processes) may be a cause of increased component failures (sometimes in the 100 ppm range). A reason for this may be, for example, a decoupling of mechanical vibrations or movements, which allow the weight to move unchecked at or above a particular frequency. Due to these movements, the moving weights may strike against the stationary electrodes, sometimes with a very high mechanical impulse. These impact events may damage both the moving weights and the stationary electrodes, or, in the extreme case, even destroy them. In addition, due to the above-mentioned impact events, particles may be formed, which may further limit the operability of the components.

SUMMARY OF THE INVENTION

Therefore, an object of the present invention is to provide an improved method for manufacturing a MEMS element.

According to a first aspect, the object is achieved by a method for manufacturing a MEMS element, including the steps:

a) forming a least one stationary weight element and at least one moving weight element in the MEMS element; and b) positioning at least one fixing element at the stationary weight element and at the moving weight element, the fixing element being formed so as to be able to be severed.

According to a second aspect, the object is achieved by a MEMS element including:

at least one stationary weight element;

at least one moving weight element; and at least one fixing element situated at the stationary weight element and at the moving weight element, the fixing element being formed so as to be able to be severed.

The weight elements are mechanically fixed in position with respect to one another by the fixing element, through which, in an advantageous manner, the moving weight element may no longer strike the stationary weight element. For example, in the course of a subsequent calibration procedure for the sensor element, the fixing element may be removed again in a simple manner; separate steps also being able to be provided for releasing the fixing element. As a result, in this manner, cost-effective integrated component protection is provided, which is already present in the process flow, since no additional masks or materials are necessary to provide it.

Advantageous refinements of the method and the MEMS element are the subject matter of dependent claims.

One advantageous further refinement of the method provides that the fixing element be made of a bonding material. In this manner, material already present in the process may advantageously be used for manufacturing the MEMS element.

A further advantageous refinement of the method provides for at least two fixing elements to be positioned specularly symmetrically at the moving weight element. In this manner, the overall rigidity of the MEMS element may be advantageously increased during packaging operations.

One further advantageous refinement of the method provides for the bonding material to be deposited onto a substrate of the MEMS element, the substrate material being removed underneath the bonding material. In this manner, the fixing element is initially formed to be non-self-supporting. Using adapted etching processes, the fixing element is subsequently released between the stationary weight element and the moving weight element. This allows a particularly resource-conserving method to be provided, since only etching parameters must be suitably adjusted.

One further advantageous refinement of the method provides for a sacrificial layer to be deposited onto a substrate of the MEMS element, the bonding material being deposited onto the substrate of the MEMS element, and the substrate being removed underneath the bonding material. In this manner, an alternative method for manufacturing the fixing element is provided.

One further advantageous refinement of the method provides for the fixing element to be formed so as to have at least one central bar-shaped and/or meander-shaped and/or wedge-shaped section. In this manner, different release strategies are rendered possible for the fixing element, for example, using the flow of an electric current. In this manner, a melting temperature for separating or severing the fixing element in the central region may be realized easily.

In the following, the present invention is described in detail with further features and advantages, using several figures. Identical or functionally equivalent elements have the same reference characters. The figures are primarily intended for basic understanding and are not constructed absolutely true to scale.

DETAILED DESCRIPTION

With the aid of the present invention, moving weights of a MEMS element are mechanically fixed in position temporarily, for example, during the above-mentioned handling and packaging operations. Examples of such operations include: transport of component parts, wire bonding, molding processes and/or sawing operations, etc. The above-mentioned operations may induce mechanical vibrations in the component part to a considerable extent and, in this manner, mechanically excite the moving weights, which may produce unchecked motions and, as a further consequence, component damage. In this context, in the course of a processing operation in which the MEMS structure is installed together with an evaluation unit, particles may break away and land between a moving electrode and a stationary electrode, which may result in malfunctioning of the MEMS structure.

With the aid of the present invention, the moving weight is not able to move unchecked, and consequently, impact events are no longer possible or are only possible to a highly limited extent. As a result, damage to and/or failure rates of micromechanical sensors may be markedly reduced by it.

Figure 1:
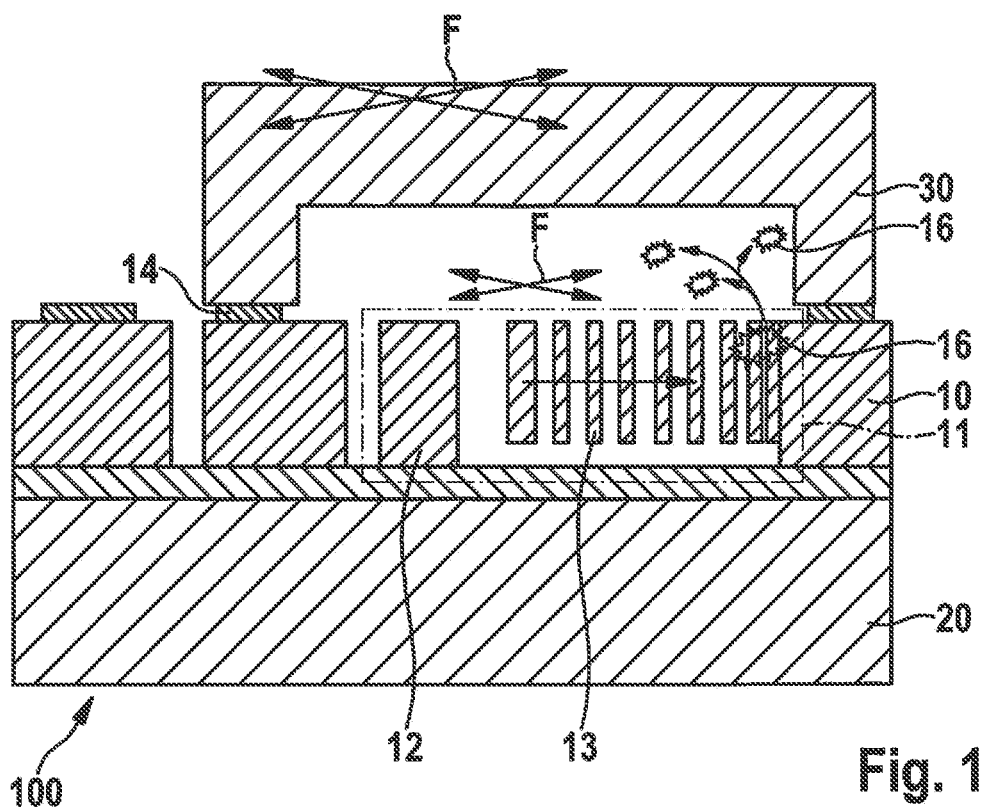
FIG. 1 shows a cross-sectional view of a micromechanical sensor element according to the related art.

FIG. 1 shows a basic cross-sectional view of a conventional micromechanical sensor element 100, which may be an inertial sensor, during one of the above-mentioned operations. To protect from environmental influences, and for the purpose of hermetically encapsulating sensitive structures, MEMS element 10 is deposited onto a substrate 20 with the aid of deposition methods, and is bonded together with a cap wafer 30, using a bonding frame 14. A common bonding process used for this is the eutectic bonding of, for example, aluminum to germanium. For the purpose of illustration, a sensor core 11 of MEMS element 10 is marked symbolically in outline.

In FIG. 1, forces F acting upon sensor element 100 are indicated by intersecting arrows, which means that jerky movements of moving weight element 13 may occur, the moving weight element striking against a stationary weight element 12. This may cause particles 16 to break away, which may get stuck in gaps of moving weight element 13, thereby being able to permanently affect or damage a sensing characteristic of sensor element 100.

Figure 2:
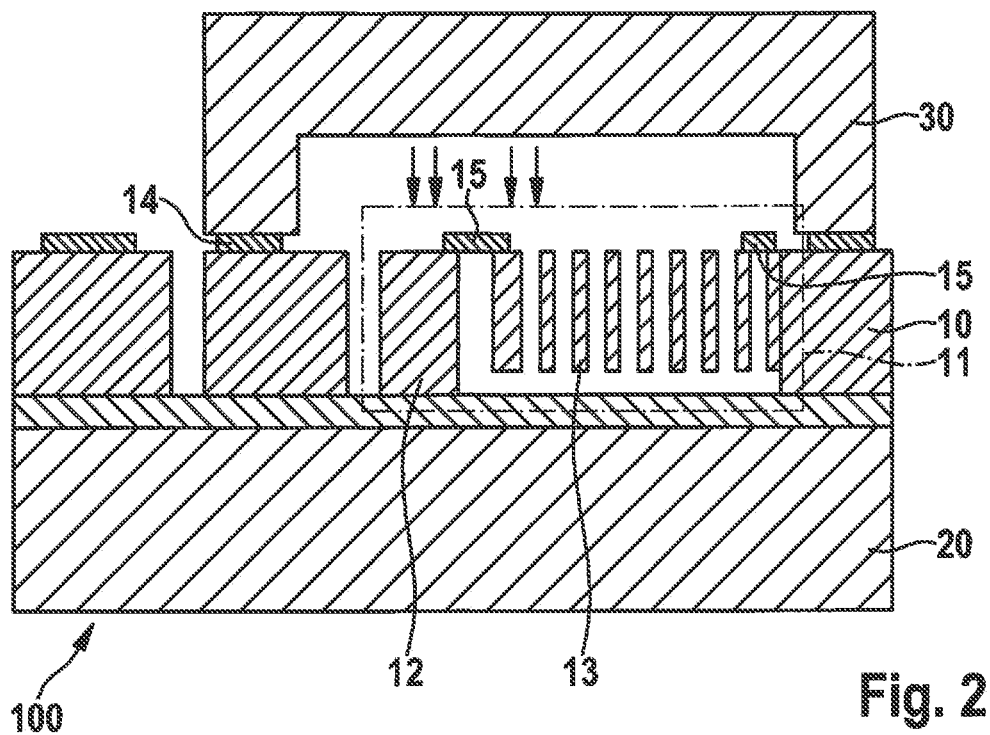
FIG. 2 shows a cross-sectional view of a micromechanical sensor element including a specific embodiment of the MEMS element according to the present invention.

A temporarily mounted securing or fixing element 15 is provided, which joins weight elements 12, 13 to one another, as indicated in FIG. 2. In this context, fixing element 15 may be integrated completely in a typical process flow for manufacturing micromechanical components. For this purpose, only mask layouts have to be appropriately adapted. The securing mechanism typically takes the form of a type of a crosspiece or bridge between stationary weight element 12 and moving weight element 13.

The material (e.g. aluminum, copper, germanium, etc.), which may be used for bonding frame 14 of sensor element 100, may also be used as a material for fixing element 15. Consequently, the mask layout already available may advantageously be used, and additional process steps are not necessary. In this manner, the manufacturing method of a micromechanical component is not changed, and consequently, the securing mechanism may be integrated completely into the utilized MEMS process flows. In a variation of the method, materials, which are not directly available in the typical MEMS process flow, such as silicon nitride, chromium and/or titanium, may also be used.

Figure 3:
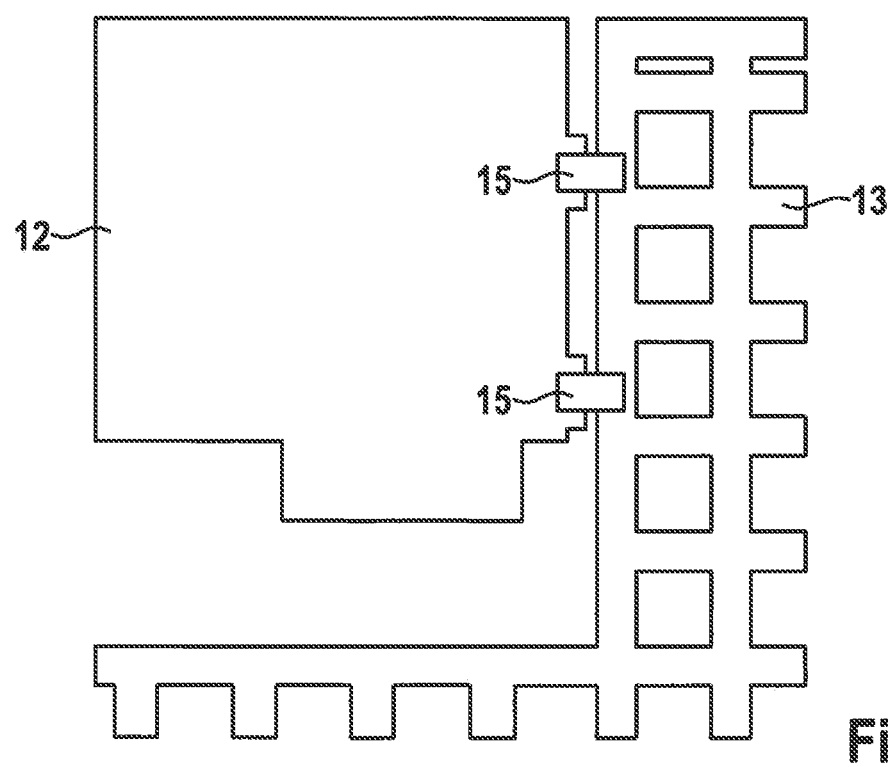
FIG. 3 shows a top view of a partial region of the set-up of FIG. 2.

FIG. 3 shows a top view of a region in FIG. 2 indicated by three arrows, a cut-away portion of moving weight element 13 and of stationary weight element 12 being represented. At least one fixing element 15 may be constructed at least one position between the moving and stationary weight element or electrode. For even more effective fixing action, several fixing elements 15 may be positioned specularly symmetrically at moving weight element 13 (not shown). A number of fixing elements 15 may be on the order of app. 1 to app. 20, still more particularly on the order of app. 2 to app. 10. For the sake of improved clarity, buried electrical conductor tracks are not shown in FIGS. 2 and 3.

As a result, this allows moving weight elements 13 to be fixed in position mechanically by a temporary joint.

Consequently, the moving weight is in a temporarily defined position, and unchecked movements are therefore precluded or only possible to a highly limited extent. In this manner, impact or striking events of the components inside of the assembly are substantially prevented, which means that damage and/or particle formation are highly limited or particularly no longer occur.

Figure 4:
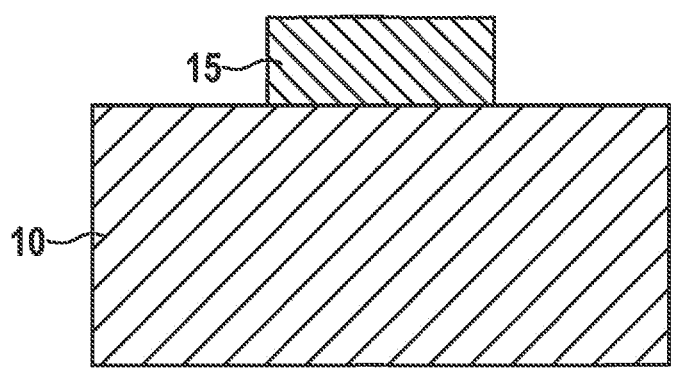
FIGS. 4, 5 and 6 show basic actions of process steps for manufacturing a fixing element.
Figure 4:
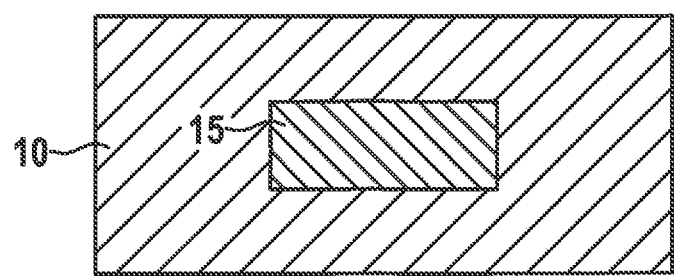
Figure 5:
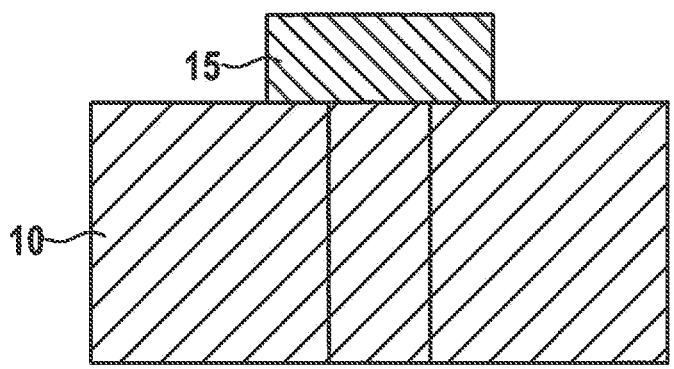
Figure 5:
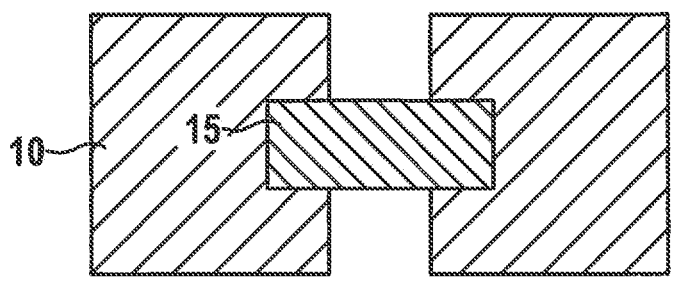
Figure 6:
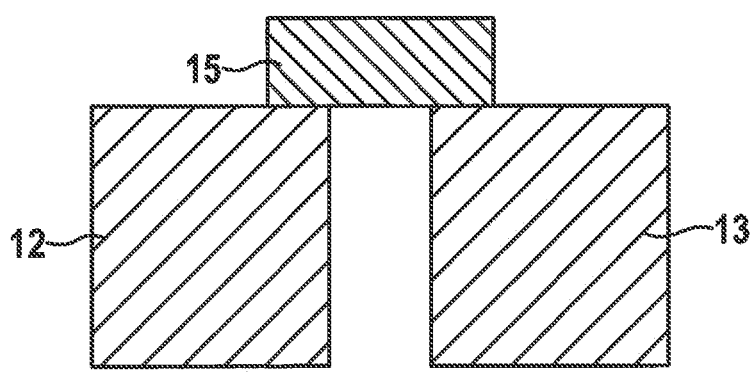
Figure 6:
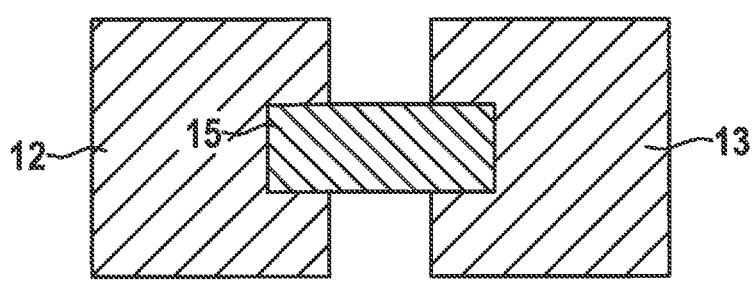

FIG. 4 through 6 show results of process steps for producing a fixing element 15. FIG. 4 shows a fixing element 15 deposited onto a substrate material of MEMS element 10. FIG. 5 shows a result of an essentially vertical etching process onto fixing element 15, where substrate material remains underneath fixing element 15. Therefore, as indicated in FIG. 6, it is necessary to provide a laterally acting etching process, in order to completely remove the substrate material beneath fixing element 15, so that weight elements 12, 13 are separated from one another and mechanically fixed in position by fixing element 15 (manufacturing without a sacrificial layer).

Figure 7:
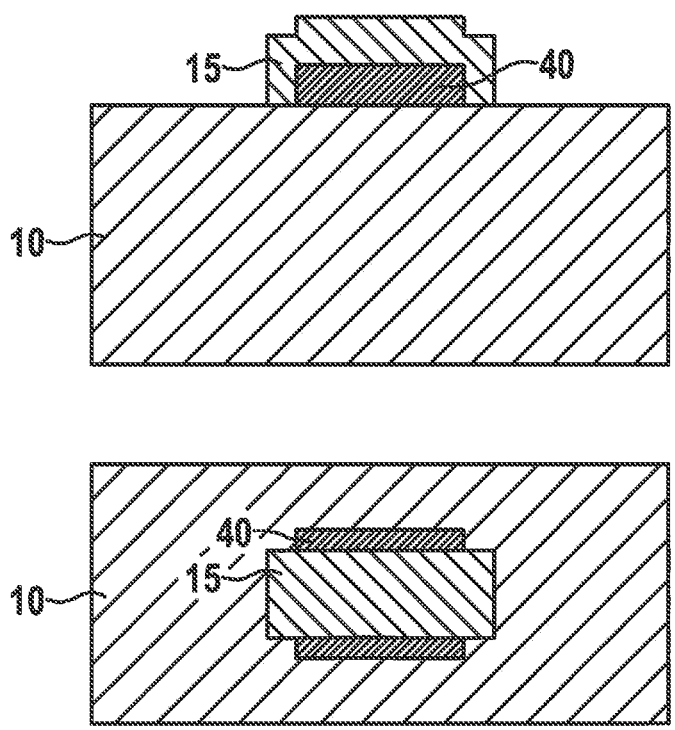
FIGS. 7 and 8 show basic actions of process steps for manufacturing a further variant of the fixing element.
Figure 8:
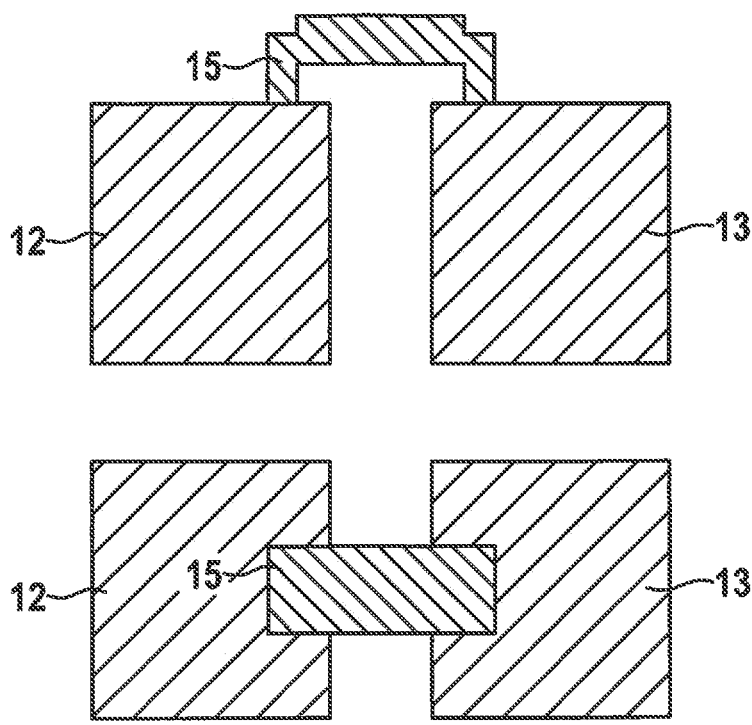

FIG. 7 and FIG. 8 show results of process steps of an alternative method for forming fixing element 15 (manufacturing with a sacrificial layer), the method being somewhat more costly with regard to process technology. In this case, as indicated in FIG. 7, fixing element 15 is initially deposited onto a sacrificial layer 40 on the substrate material of MEMS element 10. This step becomes necessary in view of the fact that, due to the anisotropy of the Si-etching process (trenching), the region below sacrificial layer 40 cannot be removed completely, that is, when the undercuts dependent on the process are not sufficient. Oxides or photoresists may be used as materials for sacrificial layer 40.

Figure 9:
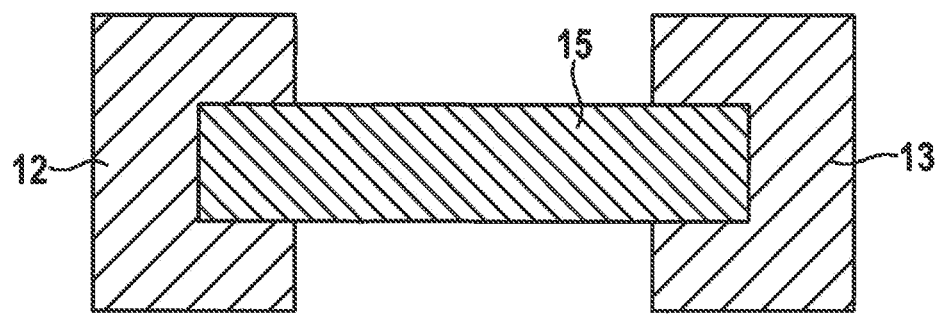
FIGS. 9, 10 and 11 show a plurality of possible geometric shapes of fixing elements.
Figure 10:
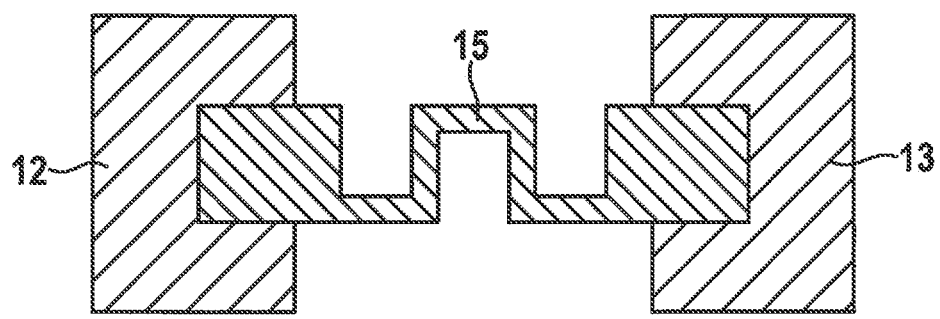
Figure 11:
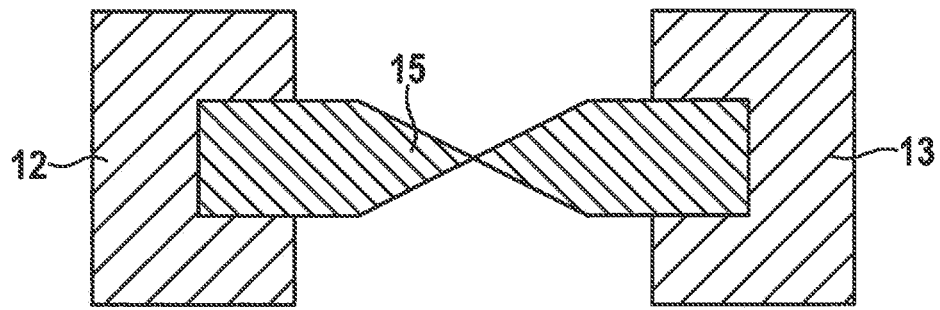

FIGS. 9 through 11 show different geometric forms of fixing element 15. A bar-shaped form of fixing element 15 is represented in FIG. 9. A form of fixing element 15 meander-shaped at the center is represented in FIG. 10. FIG. 11 shows a fixing element 15 having two wedge-shaped sections at the center, which are formed integrally with one another at their tip regions. The different forms shown may have an influence on a removal or release process of fixing element 15.

The above-mentioned removal of fixing element 15 may be accomplished by the flow of an electric current, using the thermal energy generated by it. In this context, an electric current may be used in the course of a calibration process of sensor element 100, a high electrical current density being generated in the central region of fixing element 15.

Due to the fact that fixing element 15 is completely surrounded by vacuum or air in the central region, it is difficult to dissipate thermal energy there. In this manner, fixing element 15 is split, that is, essentially melted off, in the central region.

Figure 12:
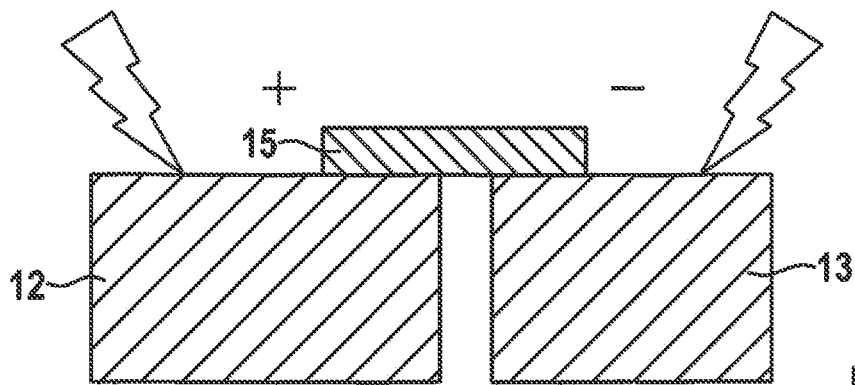
FIGS. 12, 13 and 14 show basic representations of process steps for separating or severing the fixing element.
Figure 13:
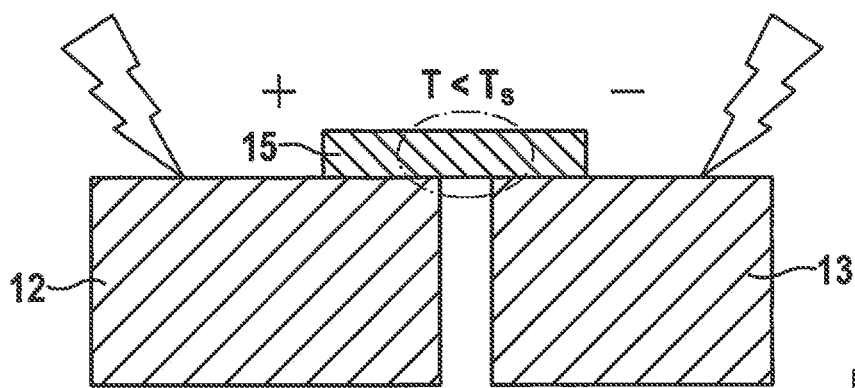
Figure 14:
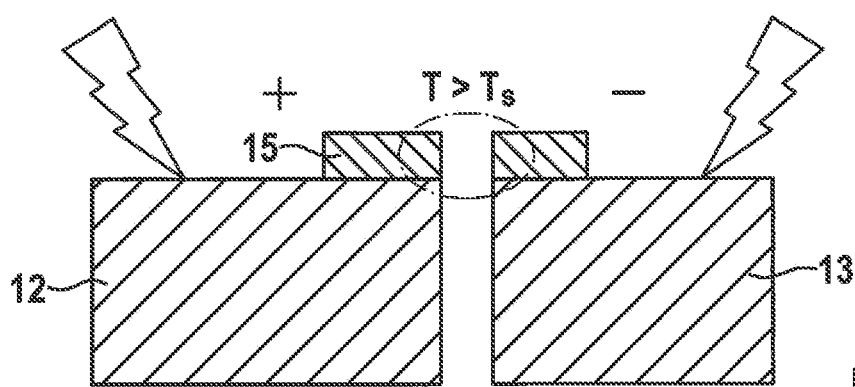

The above-mentioned operation of removal or severing of fixing element 15 is indicated in FIGS. 12 through 14. Two supply points are discernible, at which an electrical voltage is applied. In this manner, a flow of electric current through fixing element 15 is generated. FIG. 13 indicates that when a specific melting temperature $T_s$ (e.g., app. 660° C. in the case of aluminum) is not reached, fixing element 15 remains unchanged. FIG. 14 indicates that upon exceeding specific melting temperature $T_s$, fixing element 15 melts due to Joulean heat and is severed in this manner, so that the two weight elements 12, 13 are now separated from one another and moving weight element 13 can move freely in relation to stationary weight element 12. In this manner, the original principle of functioning of sensor element 100 is made available for use.

An advantageous consequence of this is that the self-supporting part of fixing element 15 is entirely surrounded by air or vacuum, and therefore, thermal conduction effects may be neglected. In this manner, the temperature increase is effectively most highly developed in the self-supporting part of fixing element 15.

Fixing element 15 may be advantageously removed in a comparatively simple and brief process step (in the range of ms), through which the operability of the component parts is not impaired after release of the securing mechanism. By way of example, fixing element 15 may already be removed by a controlled flow of current during the testing of the sensor.

The above-mentioned severing or separation of fixing element 15 may advantageously be carried out during calibration of the sensor, which means that no additional process steps are necessary. In further alternatives, the impulse for severing may also be generated, for example, by laser radiation, ultrasonic energy, spark discharge or electrical short-circuit, integral temperature increase, and/or combinations of the above-mentioned processes.

The layer thickness of fixing element 15 is advantageously low, layer thicknesses in the range of app. <5 μm being advantageous. Lateral dimensions of fixing elements 15 are between app. 1 μm and app. 50 μm. Due to the above-mentioned, small geometric dimensions, material having a very low volume is melted upon release of fixing elements 15. After the release, the material positions itself in the sensor core, that is, on moving and stationary weight elements 12, 13, in the form of an intermetallic phase. In this manner, additional particle formation from any detached fixing material may be minimized.

MEMS element 10, which includes fixing element 15 and is manufactured in such a manner, may advantageously be used in all inertial sensors, for example, in yaw-rate sensors, acceleration sensors, gyroscopes and inertial measurement units.

Such an integrated and temporary securing or fixing variant may produce markedly more reliable components having a significantly higher yield.

Figure 15:
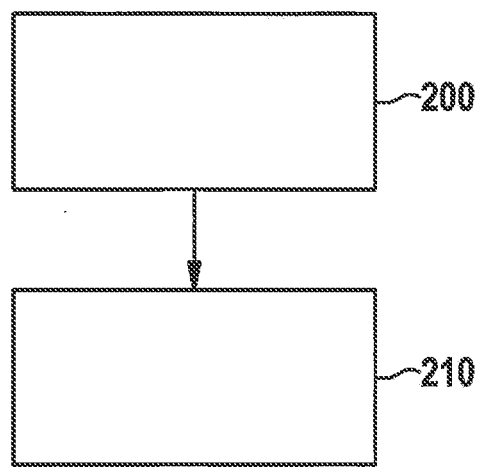
FIG. 15 shows a basic flow chart of a specific embodiment of the method according to the present invention.

FIG. 15 shows a basic flow chart of a specific embodiment of the method according to the present invention.

In a step 200, at least one stationary weight element 12 and at least one moving weight element 13 are formed in MEMS element 10.

In a step 210, at least one fixing element 15 is positioned on stationary weight element 13 and on moving weight element 12, the fixing element 15 being formed so as to be able to be split.

In summary, the present invention provides a method for manufacturing a MEMS element, which renders possible a resource-conserving, mechanical securing mechanism without additional process steps.

Although the present invention has been described in light of concrete exemplary embodiments, it is not limited to them. Therefore, moving forward, one skilled in the art will be able to implement specific embodiments not described or only partially described, without deviating from the essence of the present invention.

What is claimed is:

1. A method for manufacturing a MEMS component, the method comprising:
   forming a least one stationary weight element and at least one moving weight element in a MEMS element; and
   positioning at least one fixing element at the stationary weight element and at the moving weight element;
   wherein the fixing element is formed so as to be splittable with the aid of a flow of electric current through the fixing element, and is made of a portion of a layer of a bonding material, a second portion of the layer of bonding material being used to bond a cap to the MEMS component, wherein the portion of the layer of bonding material of the fixing element is formed using a same mask and a same process step as is used to form the second portion of the layer of bonding material used to bond the cap to the MEMS component.

2. The method of claim 1, wherein at least two fixing elements are positioned specularly symmetrically at the moving weight element.

3. The method of claim 1, wherein the fixing element is formed so as to have at least one central bar-shaped and/or meander-shaped and/or wedge-shaped section.

4. The method of claim 1, wherein the MEMS element includes an inertial sensor.

5. The method of claim 1, wherein the fixing element includes at least one solid layer.

6. The method of claim 1, wherein the bonding material is deposited onto a substrate of the MEMS element, and the substrate is removed underneath the bonding material subsequent to the bonding material being deposited.

7. The method of claim 1, wherein a sacrificial layer is deposited onto a substrate of the MEMS element, the bonding material is deposited onto the sacrificial layer and the substrate of the MEMS element, and the substrate and the sacrificial layer is removed underneath the bonding material subsequent to the sacrificial layer and the bonding material being deposited.

8. The method of claim 1, wherein the fixing element has at least one central meander-shaped section.

9. The method of claim 1, wherein the fixing element has at least one central wedge-shaped section.

10. The method of claim 1, wherein the fixing element has two wedge-shaped sections at a center of the fixing element, which are formed integrally with each other at tip regions of the wedge-shaped sections.

11. The method of claim 1, wherein the fixing element has at least one central section having a first width smaller than a second width of an end section of the fixing element.

12. The method of claim 1, further comprising splitting the fixing element after handling and packaging operations including at least one of: transporting the MEMS component, performing a wire boding process on the MEMS component, performing a packaging molding process on the MEMS component, or performing a sawing operation on the MEMS component.

13. The method of claim 1, wherein the cap hermetically seals the MEMS element.

14. The method of claim 1, wherein the bonding material includes at least one of: aluminum, copper or germanium.

15. The method of claim 1, further comprising splitting the fixing element during calibration of the MEMS component.

16. A method for manufacturing a MEMS component, the method comprising:
forming a least one stationary weight element and at least one moving weight element in a MEMS element; and
positioning at least one fixing element at the stationary weight element and at the moving weight element;
wherein the fixing element is formed so as to be splittable with the aid of a flow of electric current through the fixing element,
wherein the fixing element is made of a bonding material, the bonding material is deposited onto a substrate of the MEMS element, and the substrate is removed underneath the bonding material subsequent to the bonding material being deposited, and
wherein at least a first part of a portion of the bonding material forming the fixing element is formed on at least one layer of the substrate, and at least a second part of the portion of the bonding material forming the fixing element has the at least one layer removed underneath the second part of the portion of the bonding material.

17. The method of claim 16, wherein the deposited bonding material is used to bond a cap about the MEMS element.

18. A method for manufacturing a MEMS component, the method comprising:
forming a least one stationary weight element and at least one moving weight element in a MEMS element; and
positioning at least one fixing element at the stationary weight element and at the moving weight element;
wherein the fixing element is formed so as to be splittable with the aid of a flow of electric current through the fixing element,
wherein the fixing element is made of a bonding material, a sacrificial layer is deposited onto a substrate of the MEMS element, the bonding material is deposited onto the sacrificial layer and the substrate of the MEMS element, and the substrate and the sacrificial layer are removed underneath the bonding material subsequent to the sacrificial layer and the bonding material being deposited, and
wherein at least a first part of a portion of the bonding material forming the fixing element is formed on at least one layer of the substrate, and at least a second part of the portion of the bonding material forming the fixing element has the at least one layer removed underneath the second part of the portion of the bonding material.

19. The method of claim 18, wherein the deposited bonding material is used to bond a cap about the MEMS element.

20. A MEMS element, comprising:
at least one stationary weight element;
at least one moving weight element; and
at least one fixing element situated at the stationary weight element and at the moving weight element;
wherein the fixing element is formed so as to be splittable with the aid of a flow of electric current through the fixing element, and is made of a portion of a layer of a bonding material, a second portion of the layer of bonding material being used to bond a cap about the MEMS element, and
wherein at least a first part of the portion of the bonding material forming the fixing element is formed on at least one layer, and at least a second part of the portion of the bonding material forming the fixing element has the at least one layer removed underneath the second part of the portion of the bonding material.

21. The MEMS element of claim 20, wherein the fixing element has at least one central bar-shaped and/or meander-shaped and/or wedge-shaped section.

22. The MEMS element of claim 20, wherein the fixing element includes at least one solid layer.

23. The MEMS element of claim 20, wherein the bonding material includes at least one of: aluminum, copper or germanium.

24. An inertial sensor, comprising:
a MEMS element, including:
at least one stationary weight element;
at least one moving weight element; and
at least one fixing element situated at the stationary weight element and at the moving weight element;
wherein the fixing element is formed so as to be splittable with the aid of a flow of electric current through the fixing element, and is made of a portion of a layer of a bonding material, a second portion of the layer of bonding material being used to bond a cap about the MEMS element, and
wherein at least a first part of the portion of the bonding material forming the fixing element is formed on at least one layer, and at least a second part of the portion of the bonding material forming the fixing element has the at least one layer removed underneath the second part of the portion of the bonding material.

25. The inertial sensor of claim 24, wherein the fixing element includes at least one solid layer.

26. The inertial sensor of claim 24, wherein the fixing element is splittable into at least two pieces.

27. A method for manufacturing a MEMS component, the method comprising:
forming a least one stationary weight element and at least one moving weight element in a MEMS element; and
positioning at least one fixing element at the stationary weight element and at the moving weight element;
wherein the fixing element is formed so as to be splittable into at least two pieces, and is made of a portion of a layer of a bonding material, a second portion of the layer of bonding material being used to bond a cap to the MEMS component, wherein the portion of the layer of bonding material of the fixing element is formed using a same mask and a same process step as is used to form the second portion of the layer of bonding material used to bond the cap to the MEMS component.

28. A MEMS element, comprising:
at least one stationary weight element;
at least one moving weight element; and
at least one fixing element situated at the stationary weight element and at the moving weight element;
wherein the fixing element is formed so as to be splittable into at least two pieces, and is made of a portion of a layer of a bonding material, a second portion of the layer of bonding material being used to bond a cap about the MEMS element, and
wherein at least a first part of the portion of the bonding material forming the fixing element is formed on at least one layer, and at least a second part of the portion of the bonding material forming the fixing element has the at least one layer removed underneath the second part of the portion of the bonding material.

* * * * *